(12) United States Patent
Chu et al.

(10) Patent No.: US 11,234,339 B2
(45) Date of Patent: Jan. 25, 2022

(54) ELECTRONIC DEVICE AND HOUSING THEREOF

(71) Applicant: AU OPTRONICS CORPORATION, Hsin-Chu (TW)

(72) Inventors: Chia-Ching Chu, Hsin-Chu (TW); Pin-Miao Liu, Hsin-Chu (TW); Ren-Wei Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/103,227

(22) Filed: Nov. 24, 2020

(65) Prior Publication Data

US 2021/0168954 A1 Jun. 3, 2021

(30) Foreign Application Priority Data

Dec. 2, 2019 (TW) ................................. 108143998

(51) Int. Cl.
*G06F 1/16* (2006.01)
*H05K 5/00* (2006.01)
(Continued)

(52) U.S. Cl.
CPC ......... *H05K 5/0256* (2013.01); *H05K 5/0239* (2013.01); *H05K 7/1418* (2013.01)

(58) Field of Classification Search
CPC .... H05K 5/0256; H05K 5/0239; H05K 5/026; H05K 5/0265; H05K 5/0269;
(Continued)

(56) References Cited

U.S. PATENT DOCUMENTS 6,699,128 B1 * 3/2004 Beadell .................. G07F 17/32
292/106
6,819,567 B2 * 11/2004 Baker ................... G11B 33/126
165/80.4
(Continued)

FOREIGN PATENT DOCUMENTS

CN 201174078 Y 12/2008
CN 206322077 U 7/2017
(Continued)

*Primary Examiner* — Anthony M Haughton
(74) *Attorney, Agent, or Firm* — WPAT, PC

(57) ABSTRACT

The present invention provides a housing having a housing shell with an opening, a guidance component and a door leaf set. The guidance component is arranged in the housing shell and extending along the direction away from the opening. The door leaf set has a first door leaf and a second door leaf. The first door leaf is pivotally connected the housing shell to enable the first door leaf to rotate to a first position or a second position relative to the opening. Wherein when the first door leaf is positioned at the first position, the first door leaf shields a portion of the opening; when the first door leaf is positioned at the second position, the first door leaf extends into the housing shell and defines the first installation space with the guiding component. Wherein when the first door leaf is positioned at the first position, the second door leaf can rotate to a third position or a fourth position relative to the first door leaf; when the second door leaf is positioned at the third position, the second door leaf shields another portion of the opening; when the second door leaf is positioned at the fourth position, the second door leaf extends into the housing shell and defines the second installation space with the guiding component.

14 Claims, 12 Drawing Sheets

(51) Int. Cl.
*H05K 7/00* (2006.01)
*H05K 5/02* (2006.01)
*H05K 7/14* (2006.01)

(58) Field of Classification Search
CPC .. H05K 5/0217; H05K 7/1418; H05K 7/1417; H05K 7/14; H05K 7/1402; H05K 7/1405
See application file for complete search history.

(56) References Cited

U.S. PATENT DOCUMENTS

| | | | | |
|---|---|---|---|---|
| 8,194,409 B2* | 6/2012 | Phillps | ................. | H05K 5/0256 |
| | | | | 361/756 |
| 9,167,705 B2* | 10/2015 | Kyle | .................... | H05K 5/0217 |
| 9,516,777 B2* | 12/2016 | Manda | ................ | H05K 5/0256 |
| 9,857,486 B2* | 1/2018 | Gateman | ............. | H05K 5/0247 |
| 10,342,147 B2* | 7/2019 | Wu | ........................ | E05C 19/06 |
| 10,765,036 B2* | 9/2020 | Adrian | .................. | G11B 33/08 |
| 10,847,188 B1* | 11/2020 | Liu | ..................... | G11B 33/027 |

FOREIGN PATENT DOCUMENTS

| | | | |
|---|---|---|---|
| TW | 200607167 A | | 2/2006 |
| TW | M575948 U | | 3/2019 |

* cited by examiner

ELECTRONIC DEVICE AND HOUSING THEREOF

BACKGROUND OF THE INVENTION

1. Field of the Invention

The present invention provides an electronic device and a housing thereof. More specifically, the present invention is related to a fixed-size housing and an electronic device into which modules of different sizes and specs can be inserted.

2. Description of the Prior Art

Electronic devices, for example, display panels or computers, will need to house modules of different sizes or specs to fit various user needs, such as high performance or cost reduction. Hence, module providers will produce modules with different sizes to fit user needs. For example, the Smart Display Module (SDM) produced by Intel has two specs (SDM-S and SDM-L). In such case, users or electronic device providers need to use or produce various types of electronic devices to fit various modules. The resulted diversity of device models will greatly increase the cost to maintain or produce the electronic devices.

SUMMARY OF THE INVENTION

The purpose of the present invention is providing a housing and an electronic device into which modules of different sizes and specs can be inserted to increase the usability of the housing.

An embodiment of the present invention provides a housing comprising a housing shell, a guiding component and door leaf set. The housing shell has an opening. The guiding component is arranged in the housing shell and extending along the direction away from the opening. The door leaf set includes a first door leaf and a second door leaf. The first door leaf has a first end and a second end opposite to the first end. The first end is pivotally connected to the housing shell to enable the first door leaf to rotate to a first position or a second position relative to the opening. When the first door leaf is positioned at the first position, the first door leaf shields a portion of the opening. When the first door leaf is positioned at the second position, the first door leaf extends into the housing shell and defines a first installation space with the guiding component. The second door leaf is pivotally connected to the second end to enable the second door leaf to rotate relative to the first door leaf, so that the second door leaf is capable of extending into the housing shell to define a second installation space with the guiding component.

An embodiment of the present invention provides an electronic device comprising a housing and either a first module or a second module. The housing comprising a housing shell having an opening, a guiding component arranged in the housing shell and extending along the direction away from the opening and a door leaf set. The door leaf set includes a first door leaf having a first end and a second end opposite to the first end and a second door leaf pivotally connected to the second end to enable the second door leaf to rotate relative to the first door leaf. The first end is pivotally connected to the housing shell to enable the first door leaf to rotate to a first position or a second position relative to the opening. When the first door leaf is positioned at the first position, the first door leaf shields a portion of the opening. When the first door leaf is positioned at the second position, the first door leaf extends into the housing shell and defines a first installation space with the guiding component. The second door leaf is capable of extending into the housing shell to define a second installation space with the guiding component. The first module is fitted to the first installation space, and the second module is fitted to the second module installation space.

As mentioned above, the size of the opening formed on the housing/electronic device can be adjusted by the door leaf set extending into the housing. By adjusting the size of the opening, the housing/electronic device can house modules of different sizes or specs. Therefore, one can avoid the need to develop corresponding housing and electronic devices to match the modules of different sizes or specs, so that model diversity can be avoided.

DETAILED DESCRIPTION OF THE PREFERRED EMBODIMENT

The connecting elements according to the present invention will be described in detail below through embodiments and with reference to the accompanying drawings. A person having ordinary skill in the art may understand the advantages and effects of the present disclosure through the contents disclosed in the present specification.

It should be understood that, even though the terms such as "first", "second", "third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, layer or portion may be called a second element, portion, region, layer or portion, and do not depart from the teaching of the present disclosure.

The terms "comprise", "include" or "have" used in the present specification are open-ended terms and mean to "include, but not limit to."

Unless otherwise particularly indicated, the terms, as used herein, generally have the meanings that would be commonly understood by those of ordinary skill in the art. Some terms used to describe the present disclosure are discussed below or elsewhere in this specification to provide additional guidance to those skilled in the art in connection with the description of the present disclosure.

Figure 1A:
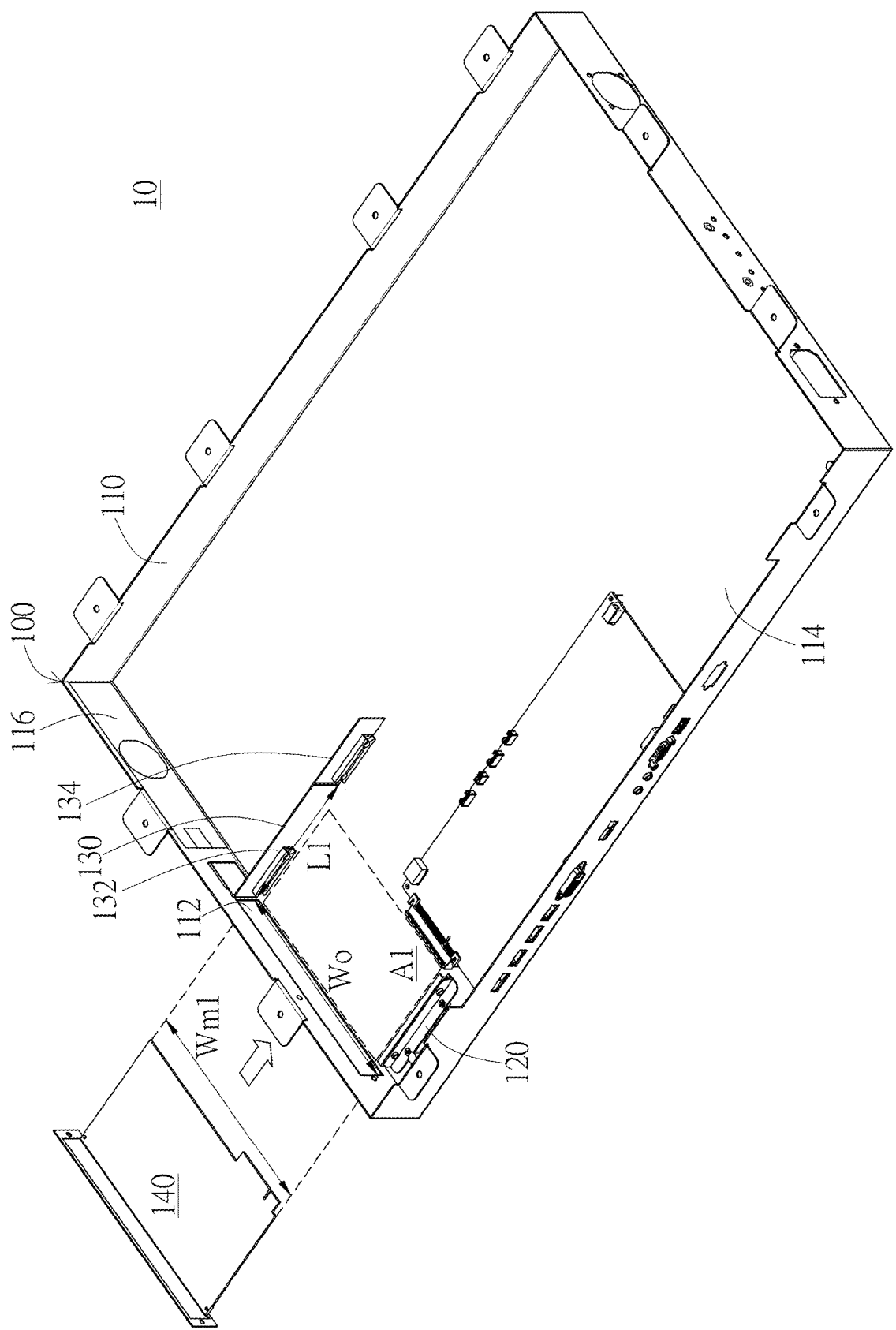
FIGS. 1A and 1B are schematic views of the housing for the installation of the first module.
Figure 1B:
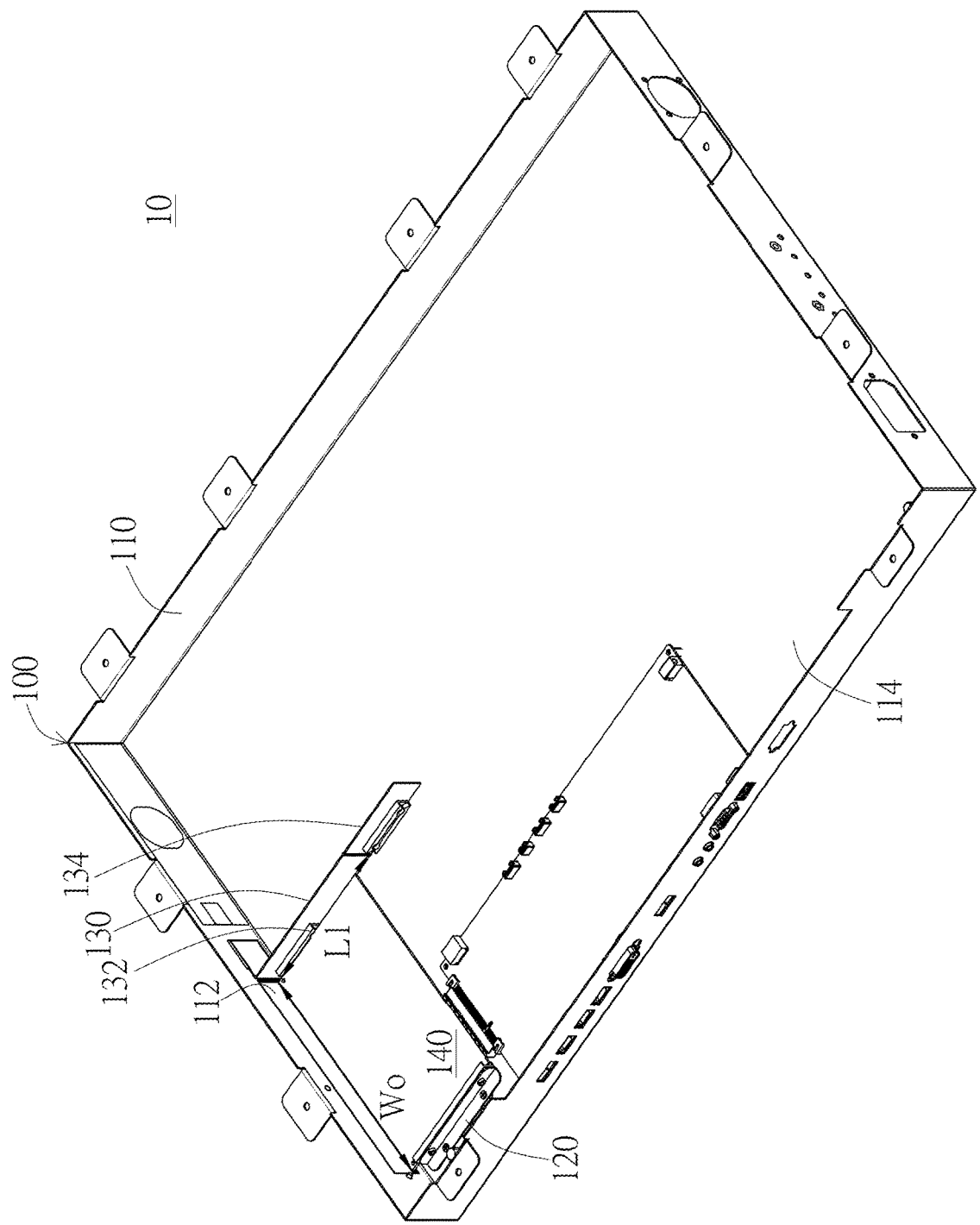
Figure 2A:
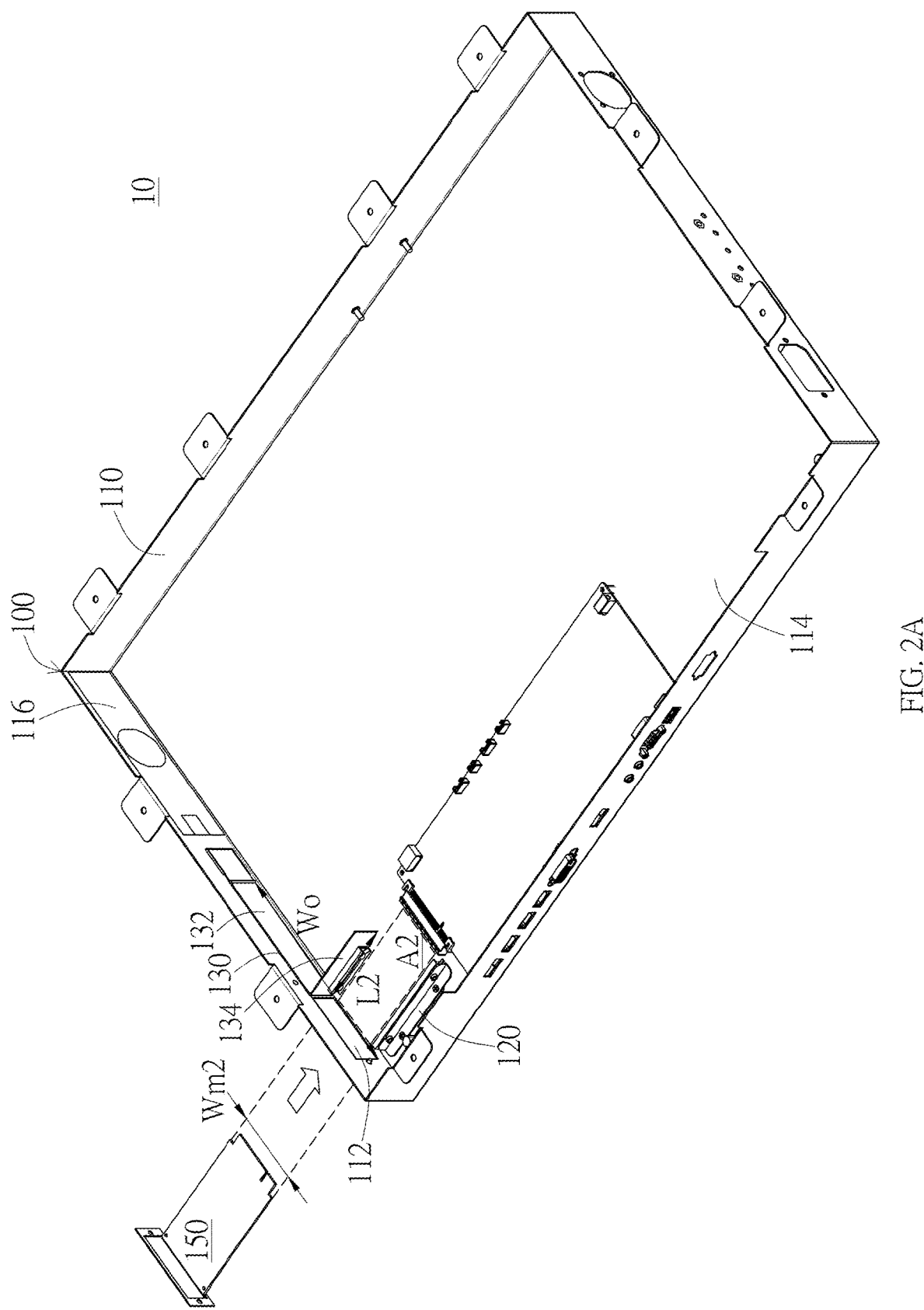
FIGS. 2A and 2B are schematic views of the housing for the installation of the second module.
Figure 2B:
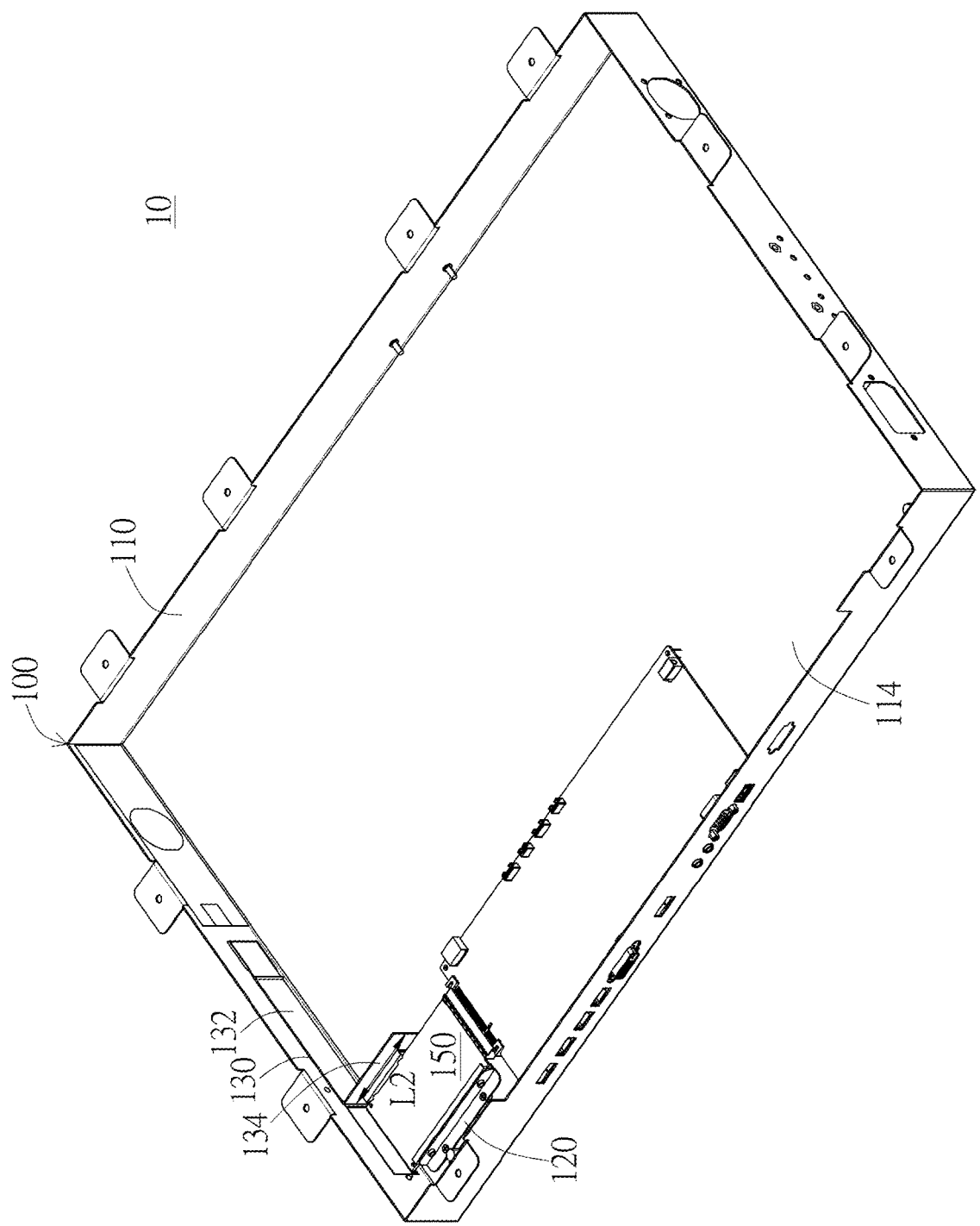

FIGS. 1A and 1B are schematic views of the housing and the installation of the first module. FIGS. 2A and 2B are schematic views of the housing and the installation of the second module. The electronic device 10 comprises the housing 100 and at least one of the first module 140 and the second module 150. The spec/size of the first module 140 is different from that of the second module 150. For example, the size (Wm1) of the first module 140 is larger than the size (Wm2) of the second module 150. Or, the volume occupied by the first module 140 after the first module 140 is installed into the housing 100 is larger than the volume occupied by the second module 150 after the second module 150 is installed into the housing 100. More specifically, when the thickness of the first module 140 is equal to the thickness of the second module 150, the width of the first module 140 relative to the opening 112 is larger than the width of the second module 150 relative to the opening 112. However, the differences between the specs of the first module 140 and the specs of the second module 150 is not limited to width. For example, the first module 140 and the second module 150 can have similar functions but different specifications, such as SDM-L and SDM-S. The first module 140 and the second module 150 can also have different functions but use the same interface, such as modules using general-purpose input/output.

Refer to FIG. 1A. The housing 100 comprises the housing shell 110, the guiding component 120 and the door leaf set 130. For example, the material of the housing shell 110 can be metal or plastic. Preferably, the material of the housing shell 110 is aluminum. The housing shell 110 can be used for integrating circuit boards, various modules, wires or cards and integrated with other devices, e.g. display panel.

As shown in FIGS. 1A and 1B, the housing shell 110 has the opening 112. The opening 112 is positioned on a side of the housing shell 110. For example, the opening 112 can be positioned on the sidewall 116 of the housing shell 110. The width of the opening 112 is preferably equal or larger than the size (Wm1) of the first module 140 to enable at least a part of the first module 140 to be inserted into the inner space of the housing shell 110 through the opening 112. For example, a part of the first module 140 is inserted into the housing shell 110 through the opening 112. The other part can be exposed to the outside of the housing shell 110 or fixed on the housing shell 110. The guiding component 120 is arranged in the housing shell 110 and extending along the direction away from the opening 112. More specifically, the guiding component 120 can be fixed on or removably arranged on the bottom plate 114 of the housing shell 110, such as using the methods of welding, locking, bolting or tenon. The angle between the bottom plate 114 and the sidewall 116 is preferably 90 degrees. In the embodiment, the guiding component 120 is a strip shape and perpendicular to the plane of the opening 112. The material of the guiding component 120 is a shapeable material such as metal or plastic. The guiding component 120 can have a guiding rail structure, slot or trapezoid structure. When the first module 140 is inserted into the inner space of the housing shell 110 through the opening 112, the first module 140 is guided by the structure of the guiding component 120 to prevent installation failure caused by shifting or skewing the first module 140. The door leaf set 130 has the first door leaf 132 and the second door leaf 134. More specifically, the material of the door leaf set 130 can be but not limited to plastic or metal, e.g. aluminum. Different or the same materials can be selected to be used as the material for the first door leaf 132 and the second door leaf 134 as appropriate. The length (L1) of the first door leaf 132 is shorter than the width (Wo) of the opening 112. Therefore, the first door leaf 132 only covers a portion of the opening 112. The length (L1) of the first door leaf 132 can be but not limited to the length of the width (Wo) of the opening 112 minus the width (WM2) of the second module 140.

Similarly, referring to FIGS. 2A and 2B, the width (Wm2) of the second module 150 is shorter than the width (Wo) of the opening 112 to enable at least a part of the second module 150 to be inserted into the inner space of the housing shell 110 through the opening 112. When the second module 150 is inserted into the inner space of the housing shell 110 through the opening 112, the second module 150 is guided by the structure of the guiding component 120 to prevent installation failure caused by shifting or skewing the second module 150. The length (L2) of the second door leaf 134 is preferably equaled to the width (Wm2) of the second module 150.

Figure 3A:
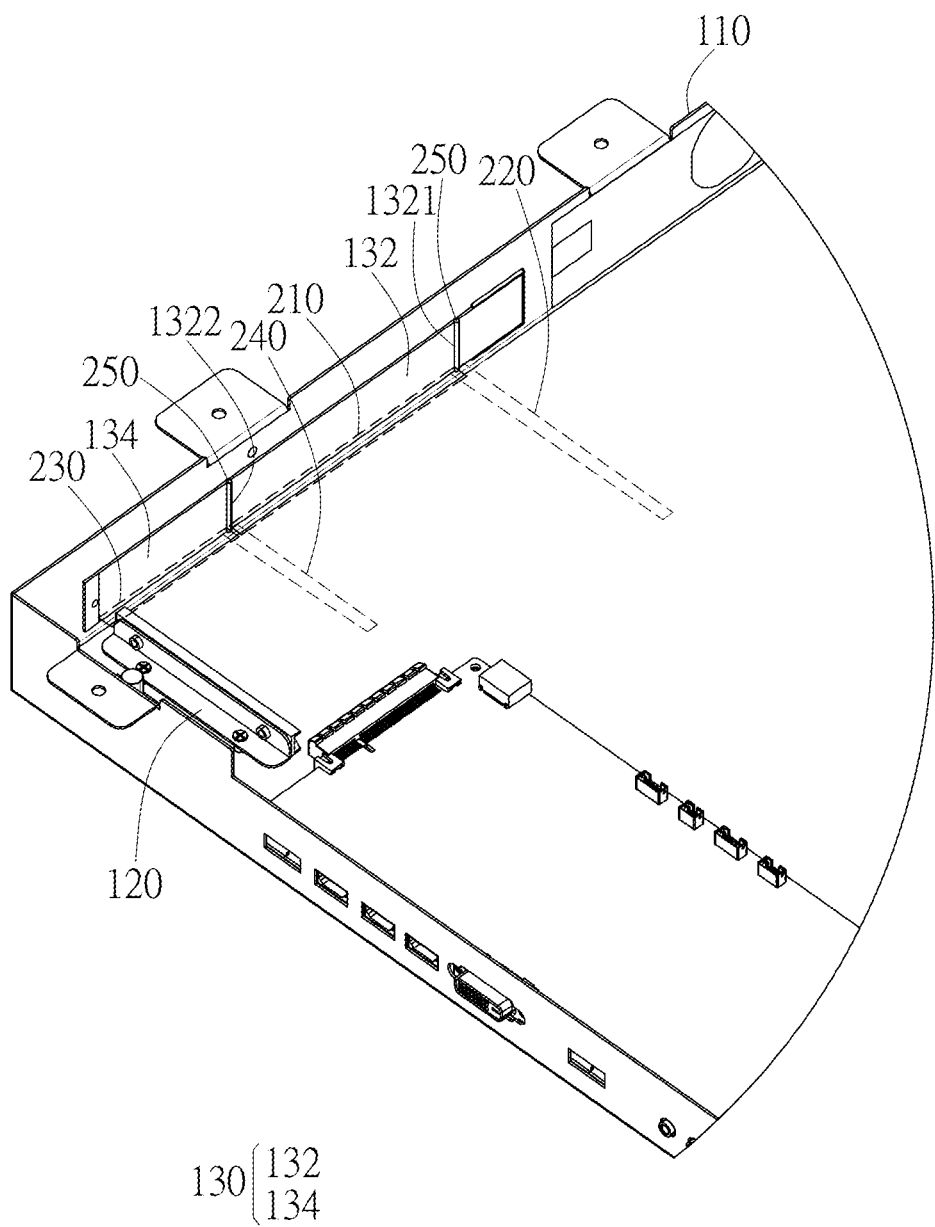
FIGS. 3A to 3C are action diagrams of the rotation of the door leaf set according to an embodiment.
Figure 3B:
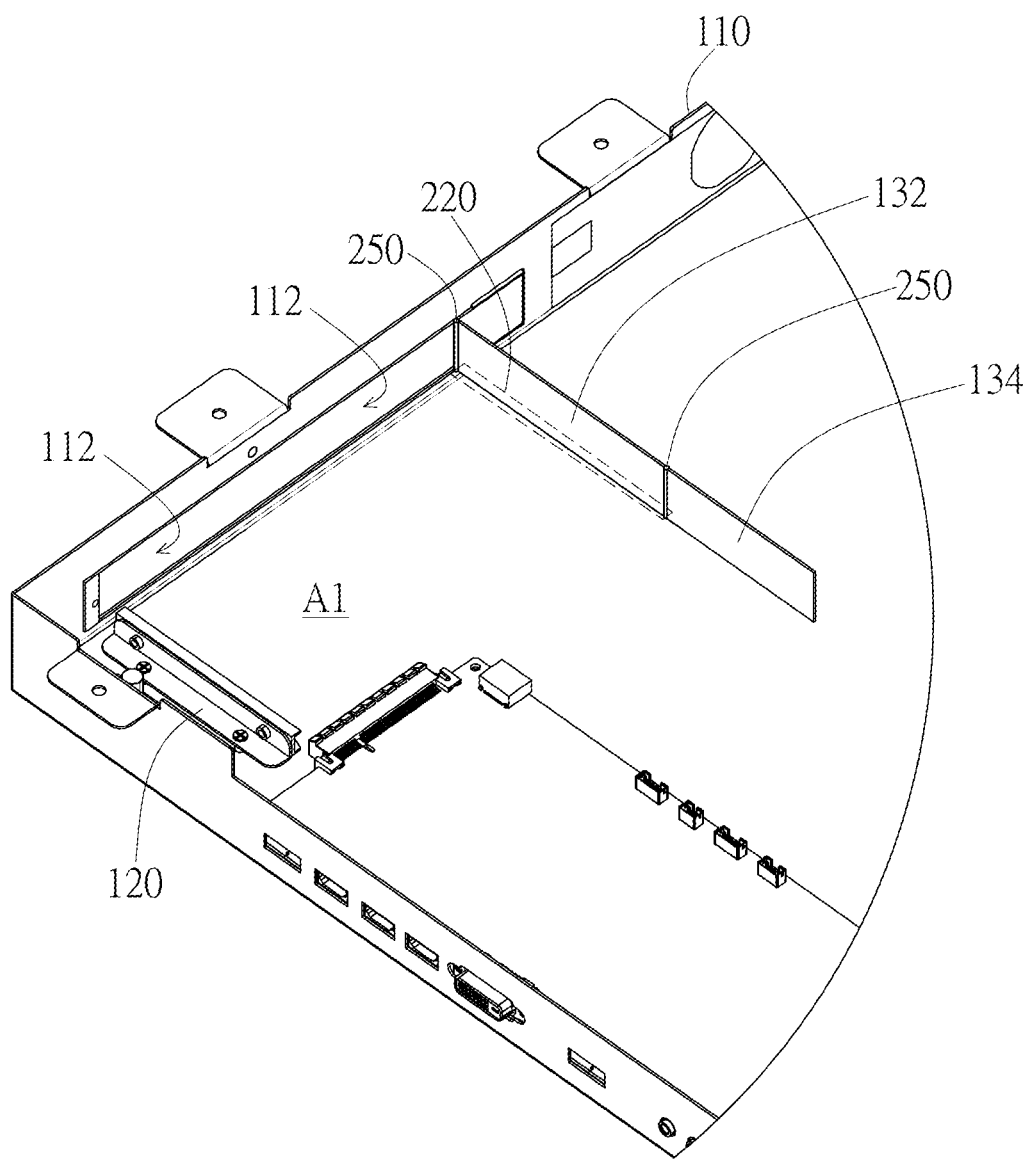
Figure 3C:
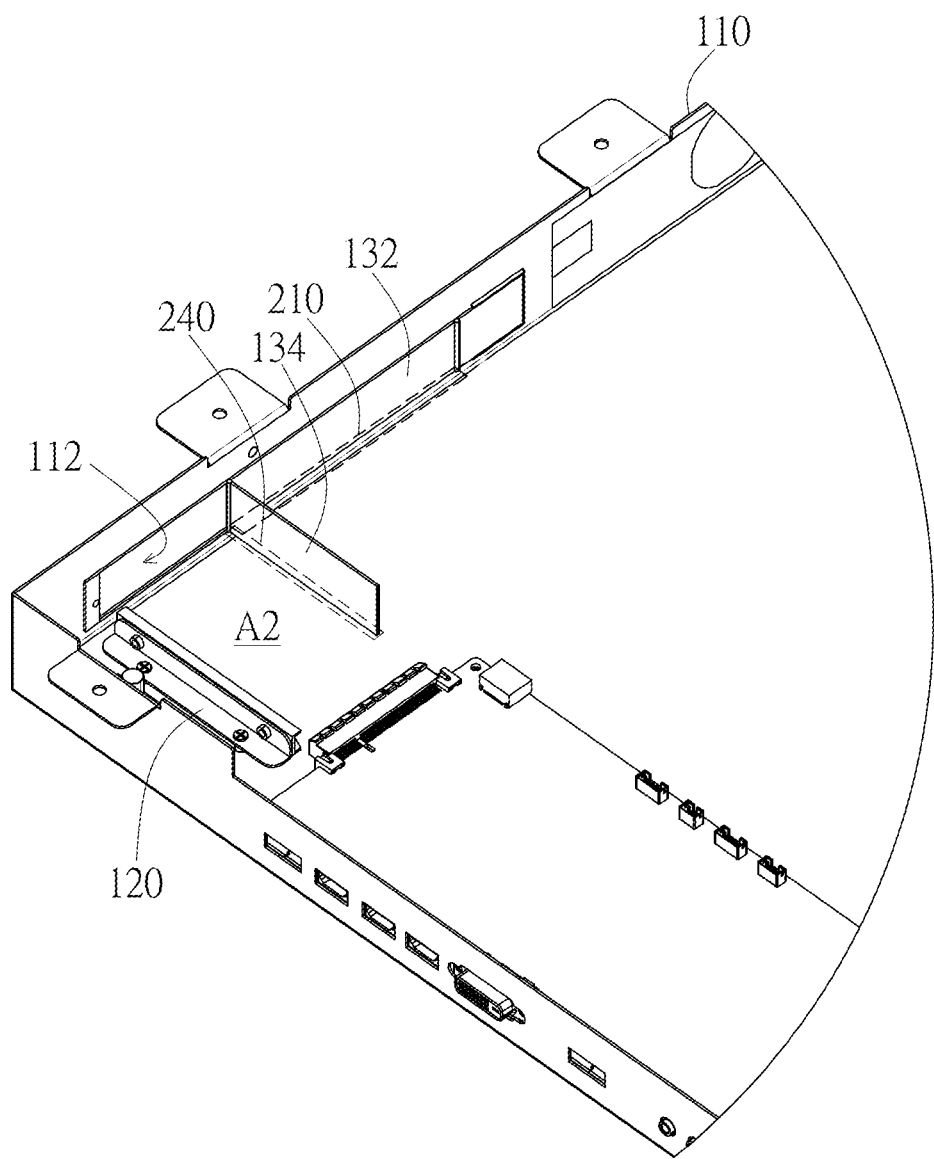

FIGS. 3A to 3C are action diagrams of the rotation of the door leaf set. Refer to FIG. 3A, the first door leaf 132 has the first end 1321 and the second end 1322 opposite to the first end 1321. In the embodiment, the first door leaf 132 has a square shape. The first end 1321 and the second end 1322 are the two short sides of the square shape. The first end 1321 is pivotally connected to the housing shell 110 to enable the first door leaf 132 to rotate to the first position 210 or the second position 220 relative to the opening 112. As shown in FIG. 3B, the definition of pivotal connection mentioned above is rotatable relatively to the joint through the connecting element 250. For example, the first end 1321 of the first door leaf 132 can be connected to the housing shell 110 by the connecting element 250, such as a hinge, and rotate relative to the opening 112 of the housing shell 110 with the connecting element 250 as the rotation axis. In addition, the first position 210 and the second position 220 are on the path of the first door leaf 132 rotating relative to the opening 112. The first position 210 is substantially positioned on the opening 112, and the second position 220 is substantially positioned in the housing shell 110.

Refer to FIGS. 3A and 3B. When the first door leaf 132 is positioned at the first position 210, the first door leaf 132 shields a portion of the opening 112. When the first door leaf 132 is positioned at the second position 220, the first door leaf 132 extends into the housing shell 110 and defines the first installation space A1 with the guiding component 120. More specifically, the first position 210 is positioned at the opening 112 and the second position 220 is positioned in the housing shell 110. The angle formed between the first position 210 and the second position 220 is in the range between 90 to 180 degrees. The angle formed between the first position 210 and the second position 220 is preferably equal to 90 degrees. When the first door leaf 132 is positioned at the second position 220, the unshielded part of the opening 112 can be extended to allow the first module 140 to be inserted into the housing shell 110 through the opening 112 and arranged at the first installation space A1 as shown in the movement in FIGS. 1A and 1B.

On the other hand, the second door leaf 134 is pivotally connected to the second end 1322 of the first door leaf 132 to enable the second door leaf 134 to rotate relative to the first door leaf 132. More specifically, the second door leaf 134 is connected to the first door leaf 132 by the connecting element 250 and rotates relative to the first door leaf 132 with the connecting element 250 as a rotation axis. When the first door leaf 132 is positioned at the first position 210, the second door leaf 134 can be rotated to the third position 230 or the fourth position 240 relative to the first door leaf 132 as shown in FIG. 3C. When the second door leaf 134 is positioned at the third position 230, the second door leaf 134 shields a portion of the opening 112. When the second door leaf 134 is positioned at the fourth position 240, the second door leaf 134 extends into the housing shell 110 and defines the second installation space A2 with the guiding component 120. When the first door leaf 132 is positioned at the first position 210, shielding a portion of the opening 112, the second door leaf 134 can rotate from the third position 230, which shields another portion of the opening 112, to the fourth position 240. When the second door leaf 134 is positioned at the fourth position 240, the second module 150 can be inserted into the housing shell 110 through the opening 112 and arranged at the second installation space A2 as shown in FIGS. 2A and 2B. In addition, the third position 230 is at the opening 112 and the fourth position 240 is in the housing shell 110. The angle formed between the third position 230 and the fourth position 240 is in the range between 90 to 180 degrees. The angle formed between the third position 230 and the fourth position 240 is preferably 90 degrees.

The first installation space A1 and the second installation space A2 are positioned in the housing shell 110. The size of the first installation space A1 is larger than the size of the second installation space A2. The area of the second installation space A2 is at least overlapping with the first installation space A1 in the housing shell 110. In other words, the second installation space A2 can be a portion of the first installation space A1.

In an embodiment, the frictional force of the first door leaf 132 rotating relative to the opening 110 is different from the frictional force of the second door leaf 134 relative to the first door leaf 132. For example, the frictional force of the first door leaf 132 rotating relative to the opening 110 is larger than the frictional force of the second door leaf 134 relative to the first door leaf 132. Under this condition, when installing the second module 150, the probability of rotating the first door leaf 132 relative to the opening 110 by accident can be reduced. In another example, the frictional force of the second door leaf 134 rotating relative to the first door leaf 132 is larger than the frictional force of the first door leaf 132 rotating relative to the opening 110. Under this condition, the undesired rotation of the second door leaf 134 relative to the first door leaf 132 in the housing shell 110 can be avoided when the first door leaf 132 rotates to the second position 220. However, the arrangement of the frictional forces is not limited to the examples mentioned above.

Figure 4:
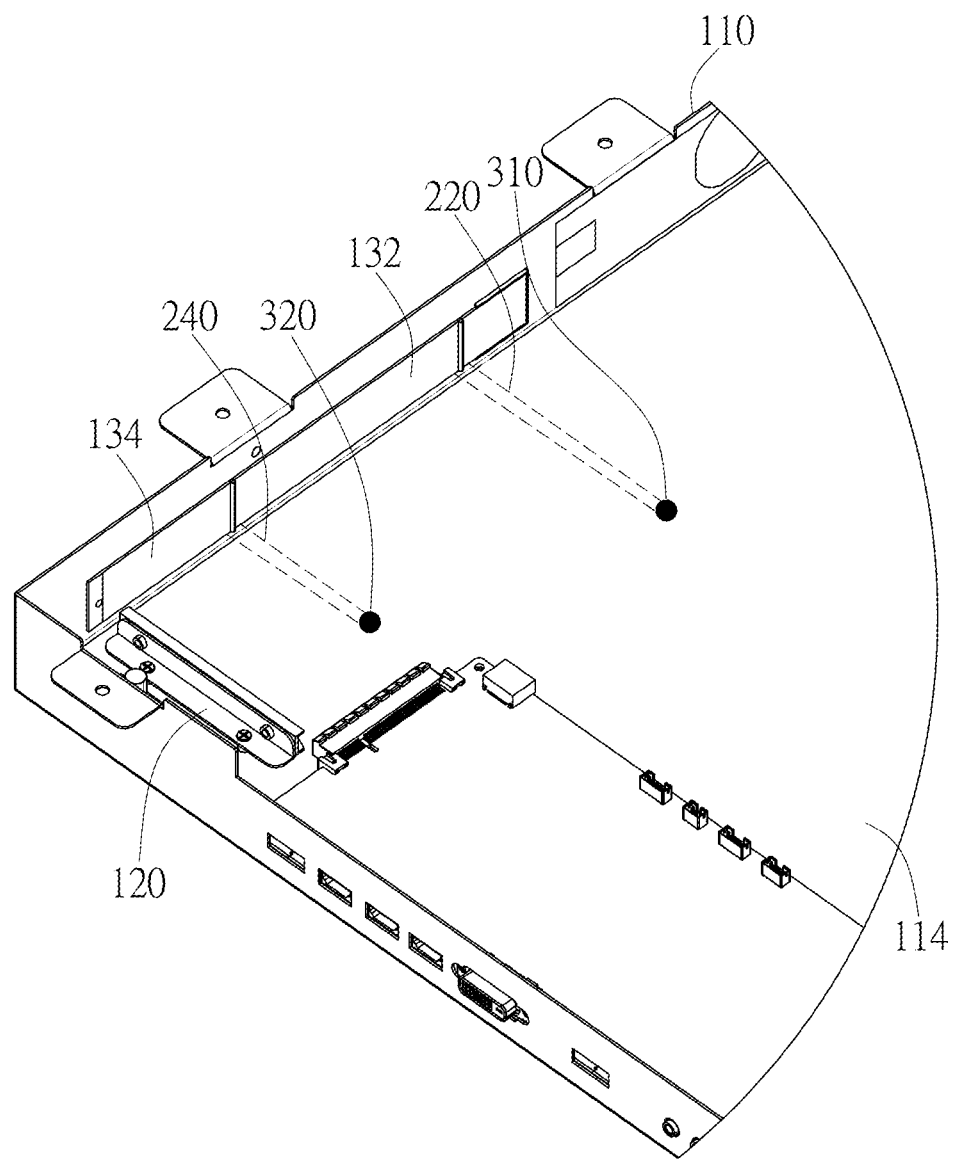
FIG. 4 is a schematic view of installing the fixing part into the housing shell according to an embodiment.

In an embodiment, referring to FIG. 4, the housing shell 110 includes the first fixing part 310. The first fixing part 310 is arranged on at least a portion of the second position 220 to fix or position the first door leaf 132 rotated to the second position 220. For example, the first fixing part 310 can be but not limited to a dot form or block form arranged on a side of the second position 220 or be a strip shape or slot arranged on the second position 220. On the other hand, the housing shell 110 includes the second fixing part 320. The second fixing part 320 is arranged on at least a portion of the fourth position 240 to fix or position the second door leaf 134 rotated to the fourth position 240. More specifically, the first fixing part 310 and the second fixing part 320 can be additional elements arranged on the bottom plate 114 of the housing shell 110 in a manner such as soldering or fixing. The first fixing part 310 and the second fixing part 320 can also be a unibody with the bottom plate 114. For example, the convex part toward the inner space of the housing shell 110 can be formed from the bottom plate 114 or shaped during fabricating the bottom plate 114. The first fixing part 310 and the second fixing part 320 can be placed at or removed from the bottom plate 114 depending on the situation. For example, when installing the first module 140, the second fixing part 320 can be removed and the first fixing part 310 can be retained. Or, the first fixing part 310 and the second fixing part 320 can be simultaneously arranged or removed. The first door leaf 132 and the second door leaf 134 can be fixed on the first fixing part 310 and the second fixing part 320 by adhesion, locking or magnetic attraction. But the fixing mechanism is not limited to the examples mentioned above. It should be noted that FIG. 4 is for the purpose of explaining the positions of the first fixing part 310 and the second fixing part 320 and not for limiting the positions or the shapes of the first fixing part 310 and the second fixing part 320.

Figure 5A:
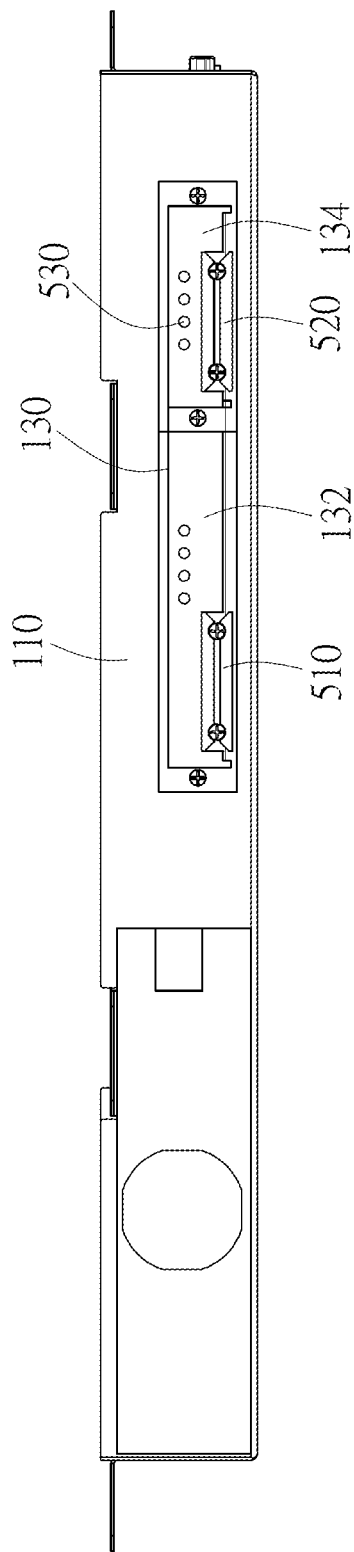
FIGS. 5A to 5C are schematic views of the door leaf according to an embodiment.
Figure 5B:
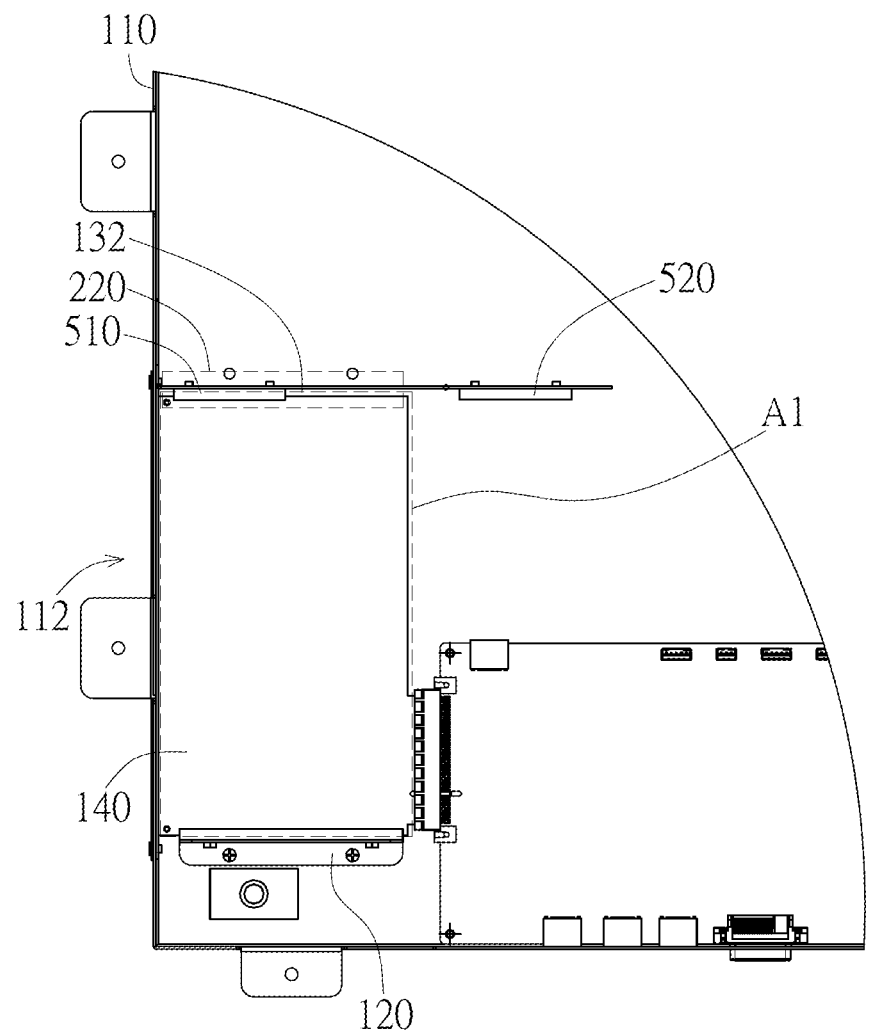
Figure 5C:
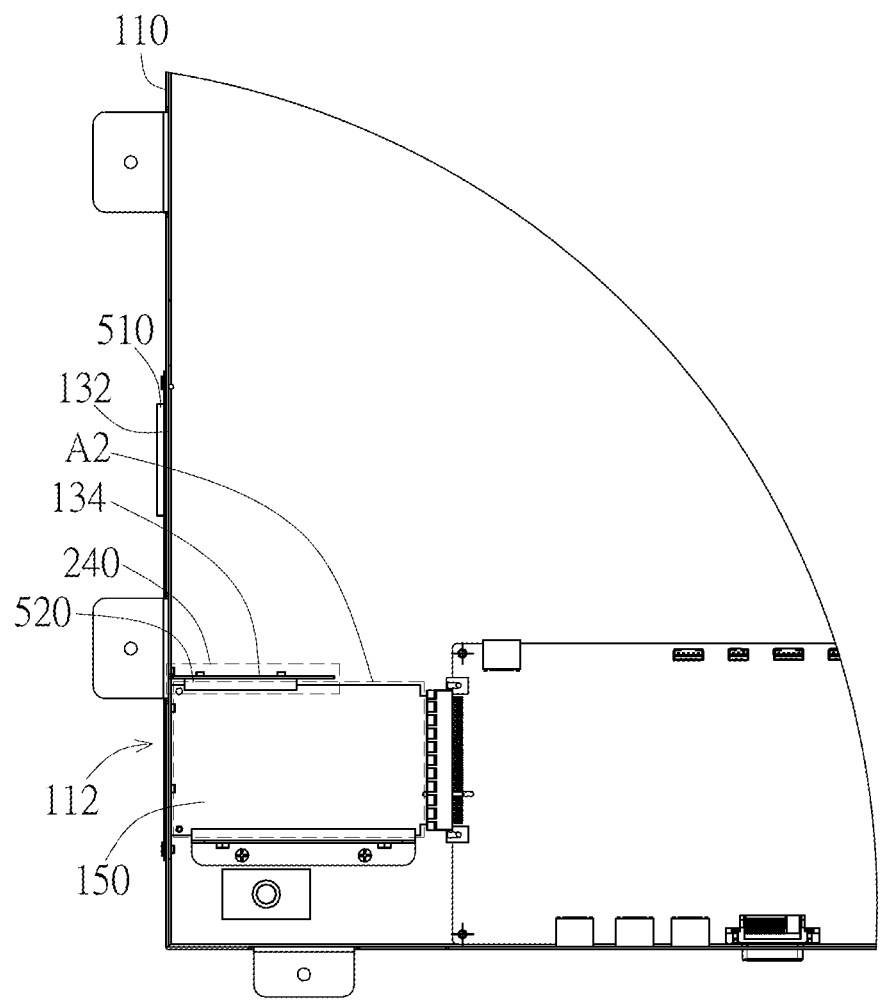
Figure 6A:
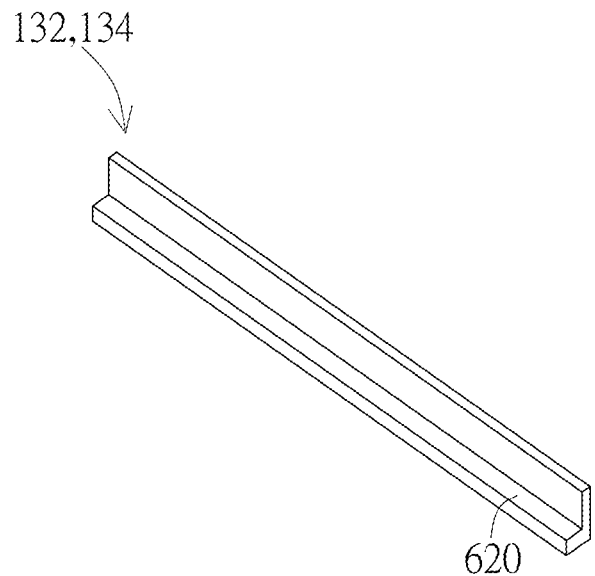
FIGS. 6A to 6B are schematic views of the door leaf according to an embodiment.
Figure 6B:
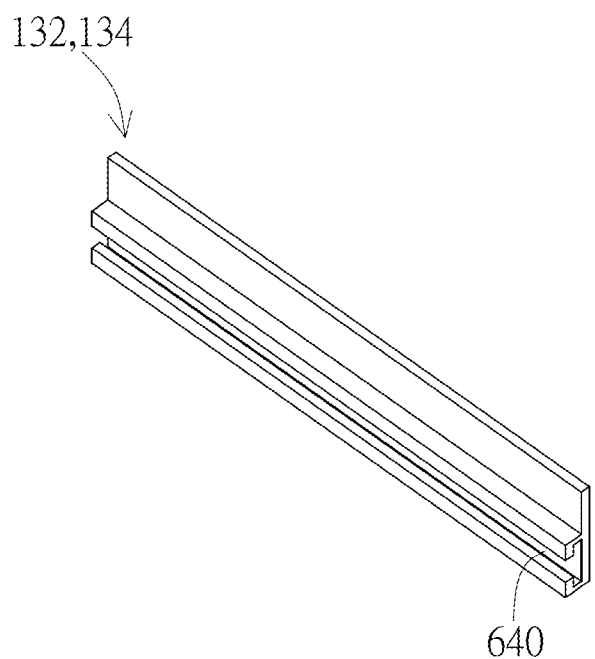

In an embodiment, referring to FIGS. 5A to 5C, the first door leaf 132 has the first guiding rail 510. When the first door leaf 132 is rotated to the second position 220, the first guiding rail 510 will face the guiding component 120 as shown in FIG. 5B. The second door leaf 134 has the second guiding rail 520. When the second door leaf 134 is rotated to the fourth position 240, the second guiding rail 520 will face the guiding component 120 as shown in FIG. 5C. More specifically, when installing the first module 140, the first module 140 can be guided to the first installation space A1 by the first guiding rail 510 and the guiding component 120. Similarly, when installing the second module 150, the second module 150 can be guided to the second installation space A2 by the second guiding rail 520 and the guiding component 120. The method for attaching the first guiding rail 510 and the second guiding rail 520 to the first door leaf 132 and the second door leaf 134 can be removable, such as by screwing, or irremovable, such as by soldering or forming a convex part on the door leaf 132 or 134. Referring to FIGS. 6A and 6B, the guiding rails 510 and 520 formed on the door leaves 132 and 134 can be the bending part 620 which bends a portion of the door leaves 132 and 134 shown in FIG. 6A. More specifically, the bending part 620 is(are) a portion of the door leaves 132 and 134 adjacent to the bottom plate 114. When the door leaves 132 and 134 are positioned at the second position 220 or the fourth position 240, the bending part is preferably facing the guiding component 120. The angle of the bending part 620 is preferably 90 degrees. Furthermore, referring to FIG. 6B, the guiding rails 510 and 520 formed on the door leaves 132 and 134 can be the slot part 640 formed on the door leaves 132 and 134 shown in FIG. 6B. More specifically, when the door leaf 132/134 is positioned at the second position 220 or the fourth position 240, the slot part 640 is preferably facing the guiding component 120. It should be noted that the number or the shape of the first guiding rail 510 and the second guiding rail 520 is not limited to the examples shown in FIGS. 5A to 5C.

In an embodiment, the first door leaf 132 and the second door leaf 134 can be marked or colored to indicate the rotating direction of the first door leaf 132 and the second door leaf 134 or the type of the corresponding module. But the reason and method for marking the first door leaf 132 and the second door leaf 134 are not limited to the above. Furthermore, the first door leaf 132 and the second door leaf 134 can have at least one hole to leak the light out from the inner space. When a user is installing or using the housing or the electronic device, the user can observe the inner space of the housing shell to confirm the installing condition of the module. But the reasons for making holes on the first door leaf 132 or the second door leaf 134 is not limited to the embodiment mentioned above.

Through the use of the housing in the present invention, the models of electronic devices will not diversify to fit various modules. It should be noted that the presented invention is not limited by the number of modules or the number of door leaves. When more than two types of modules need to be integrated into a housing, the number of door leaves can be adjusted according to the situation and be pivoted in order. Therefore, the size of the opening of the housing shell can be adjusted by the door leaf extending into housing shell to generate various installation space with different sizes to avoid the problem of type diversity.

Although the present invention discloses the aforementioned embodiments, it is not intended to limit the invention. Any person who is skilled in the art in connection with the present invention can make any change or modification without departing from the spirit and scope of the present invention. Therefore, the scope of protection of the present invention should be determined by the claims in the application.

What is claimed is:

1. A housing, comprising:
a housing shell having an opening;
a guiding component arranged in the housing shell and extending along a direction away from the opening; and
a door leaf set, including:
a first door leaf having a first end and a second end opposite to the first end, the first end pivotally connected to the housing shell to enable the first door leaf to rotate to a first position or a second position relative to the opening, wherein when the first door leaf is positioned at the first position, the first door leaf shields a portion of the opening; when the first door leaf is positioned at the second position, the first door leaf extends into the housing shell and defines a first installation space with the guiding component; and
a second door leaf pivotally connected to the second end to enable the second door leaf to rotate relative to the first door leaf, so that the second door leaf is capable of extending into the housing shell to define a second installation space with the guiding component.

2. The housing of claim 1, wherein when the first door leaf is positioned at the first position, the second door leaf rotates to a third position or a fourth position relative to the first door leaf; when the second door leaf is positioned at the third position, the second door leaf shields another portion of the opening; when the second door leaf is positioned at the fourth position, the second door leaf extends into the housing shell and defines the second installation space with the guiding component.

3. The housing of claim 1, wherein the first door leaf has a first guiding rail; when the first door leaf rotates to the second position, the first guiding rail is opposite to the guiding component.

4. The housing of claim 2, wherein the second door leaf has a second guiding rail; when the second door leaf rotates to the fourth position, the second guiding rail is opposite to the guiding component.

5. The housing of claim 1, wherein the housing shell includes a first fixing part arranged at the second position; the first fixing part is configured to position the first door leaf at the second position when the first door leaf rotates to the second position.

6. The housing of claim 2, wherein the housing shell includes a second fixing part arranged at the fourth position; the second fixing part is configured to position the second door leaf at the fourth position when the second door leaf rotates to the fourth position.

7. The housing of claim 1, wherein a friction of the first door leaf rotating relative to the opening is different from a friction of the second door leaf rotating relative to the first door leaf.

8. An electronic device, comprising:
a housing, comprising:
a housing shell having an opening;
a guiding component arranged in the housing shell and extending along a direction away from the opening; and
a door leaf set, including:
a first door leaf having a first end and a second end opposite to the first end, the first end pivotally connected to the housing shell to enable the first door leaf to rotate to a first position or a second position relative to the opening, wherein when the first door leaf is positioned at the first position, the first door leaf shields a portion of the opening; when the first door leaf is positioned at the second position, the first door leaf extends into the housing shell and defines a first installation space with the guiding component; and
a second door leaf pivotally connected to the second end to enable the second door leaf to rotate relative to the first door leaf, so that the second door leaf is capable of extending into the housing shell to define a second installation space with the guiding component; and
one of a first module and a second module;
wherein the first module is fitted to the first installation space, and the second module is fitted to the second module installation space.

9. The electronic device of claim 8, wherein when the first door leaf is positioned at the first position, the second door leaf rotates to a third position or a fourth position relative to the first door leaf; when the second door leaf is positioned at the third position, the second door leaf shields another portion of the opening; when the second door leaf is positioned at the fourth position, the second door leaf extends into the housing shell and defines the second installation space with the guiding component.

10. The electronic device of claim 8, wherein the first door leaf has a first guiding rail; when the first door leaf rotates to the second position, the first guiding rail is opposite to the guiding component.

11. The electronic device of claim 9, wherein the second door leaf has a second guiding rail; when the second door leaf rotates to the fourth position, the second guiding rail is opposite to the guiding component.

12. The electronic device of claim 8, wherein the housing shell includes a first fixing part arranged at the second position; the first fixing part is configured to position the first door leaf at the second position when the first door leaf rotates to the second position.

13. The electronic device of claim 9, wherein the housing shell includes a second fixing part arranged at the fourth position; the second fixing part is configured to position the second door leaf at the fourth position when the second door leaf rotates to the fourth position.

14. The electronic device of claim 8, wherein a friction of the first door leaf rotating relative to the opening is different from a friction of the second door leaf rotating relative to the first door leaf.

* * * * *